(12) United States Patent
Koshiishi et al.

(10) Patent No.: US 8,741,098 B2
(45) Date of Patent: Jun. 3, 2014

(54) TABLE FOR USE IN PLASMA PROCESSING SYSTEM AND PLASMA PROCESSING SYSTEM

(75) Inventors: Akira Koshiishi, Nirasaki (JP); Shinji Himori, Nirasaki (JP); Shoichiro Matsuyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 814 days.

(21) Appl. No.: 11/889,340

(22) Filed: Aug. 10, 2007

(65) Prior Publication Data
US 2008/0038162 A1     Feb. 14, 2008

Related U.S. Application Data

(60) Provisional application No. 60/844,368, filed on Sep. 14, 2006.

(30) Foreign Application Priority Data

Aug. 10, 2006   (JP) ................................. 2006-217873

(51) Int. Cl.
| C23C 16/50 | (2006.01) |
| C23C 16/00 | (2006.01) |
| C23F 1/00 | (2006.01) |
| H01L 21/306 | (2006.01) |

(52) U.S. Cl.
USPC .. 156/345.51; 118/728; 118/715; 156/345.33

(58) Field of Classification Search
USPC ........ 118/728, 729, 730; 156/345.51, 345.52, 156/345.53, 345.54, 345.55
See application file for complete search history.

(56) References Cited

U.S. PATENT DOCUMENTS 5,978,202 A * 11/1999 Wadensweiler et al. ...... 361/234
6,129,806 A * 10/2000 Kaji et al. ................ 156/345.46
(Continued)

FOREIGN PATENT DOCUMENTS

| JP | 2004-531907 A | 10/2004 |
| JP | 2004-363552 | 12/2004 |

(Continued)

OTHER PUBLICATIONS

Frederikse, H. P. R. "Dielectric Constant of Selected Polymers" from the Handbook of Chemistry and Physics 92nd Edition. Copyright 2011. Printed on Oct. 10, 2011 from http://www.hbcpnetbase.com/.*

(Continued)

*Primary Examiner* — Maureen Gramaglia
*Assistant Examiner* — Tiffany Nuckols
(74) *Attorney, Agent, or Firm* — Smith, Gambrell & Russell, LLP.

(57) ABSTRACT

Disclosed herein is a table 2 for use in a plasma processing system 1 that includes an electrically conductive member serving as a lower electrode 21 for plasma formation, a lower dielectric layer 22 (first dielectric layer) formed on the electrically conductive member so that it covers the center of the upper surface of the electrically conductive member, serving to make a high-frequency electric field to be applied to plasma via a substrate uniform, and an upper dielectric layer 24 (second dielectric layer) having a relative dielectric constant of 100 or more, formed on the electrically conductive member so that it is in contact at least with the edge of the substrate, in order to prevent a high-frequency current that has propagated along the electrically conductive member face from leaking to the outside of the substrate (wafer W).

13 Claims, 7 Drawing Sheets

(56) References Cited

U.S. PATENT DOCUMENTS

| | | | |
|---|---|---|---|
| 6,215,641 B1 * | 4/2001 | Busse et al. | 361/234 |
| 6,228,438 B1 * | 5/2001 | Schmitt | 427/569 |
| 6,483,690 B1 * | 11/2002 | Nakajima et al. | 361/234 |
| 7,149,070 B2 | 12/2006 | Breitschwerdt et al. | |
| 2005/0211384 A1 * | 9/2005 | Hayashi | 156/345.47 |
| 2005/0276928 A1 * | 12/2005 | Okumura et al. | 427/446 |

FOREIGN PATENT DOCUMENTS

| | | |
|---|---|---|
| JP | 2004-363552 A | 12/2004 |
| JP | 2005-512310 A | 4/2005 |
| WO | 03/003449 A2 | 1/2003 |

OTHER PUBLICATIONS

Copending Application, filed concurrently (Aug. 10, 2007), "Stage for Plasma Processing Apparatus, and Plasma Processing Apparatus".

Japanese Office Action issued on Feb. 28, 2012 for Application No. 2006-217873w/ English translation.

* cited by examiner

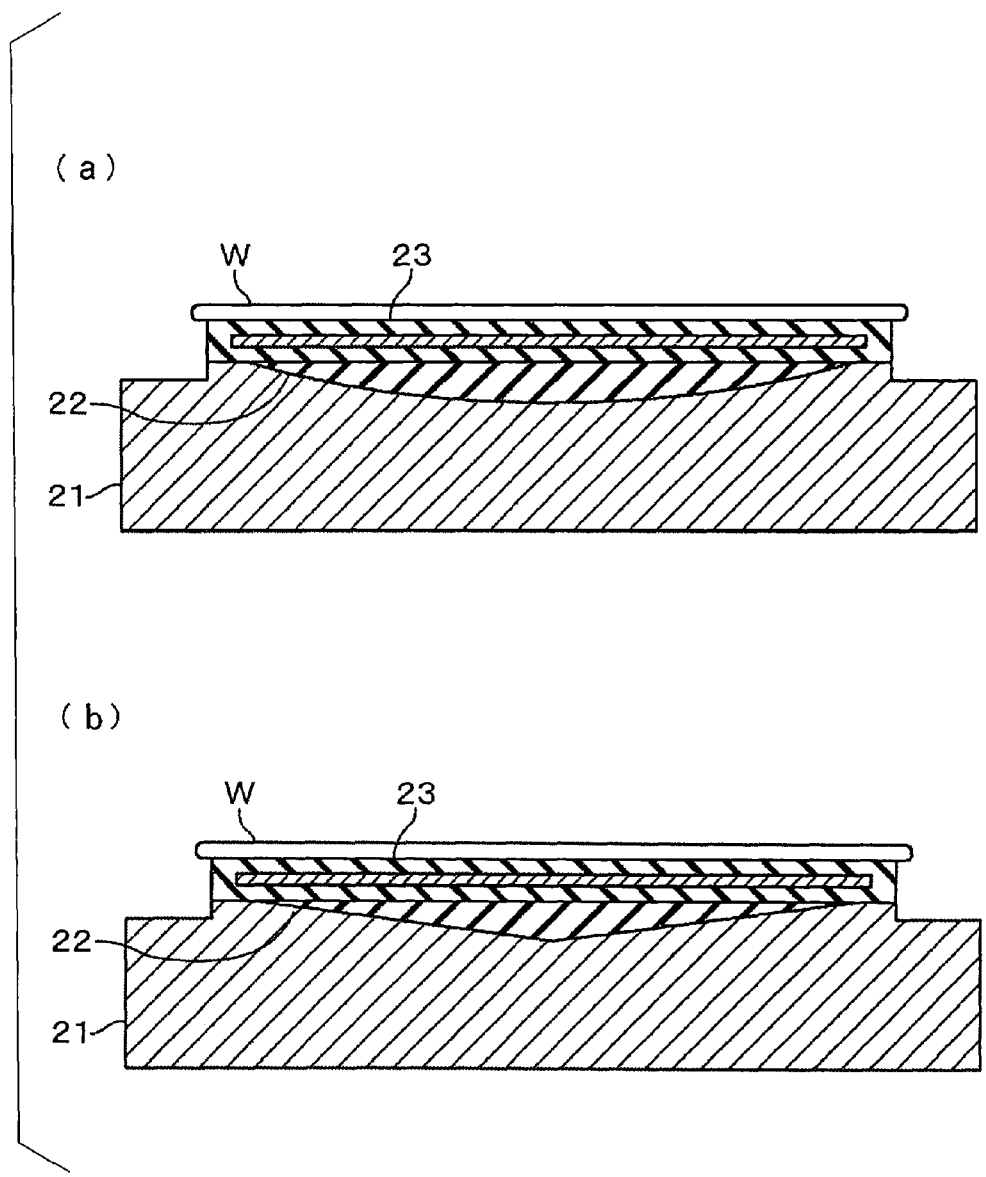
F I G. 5

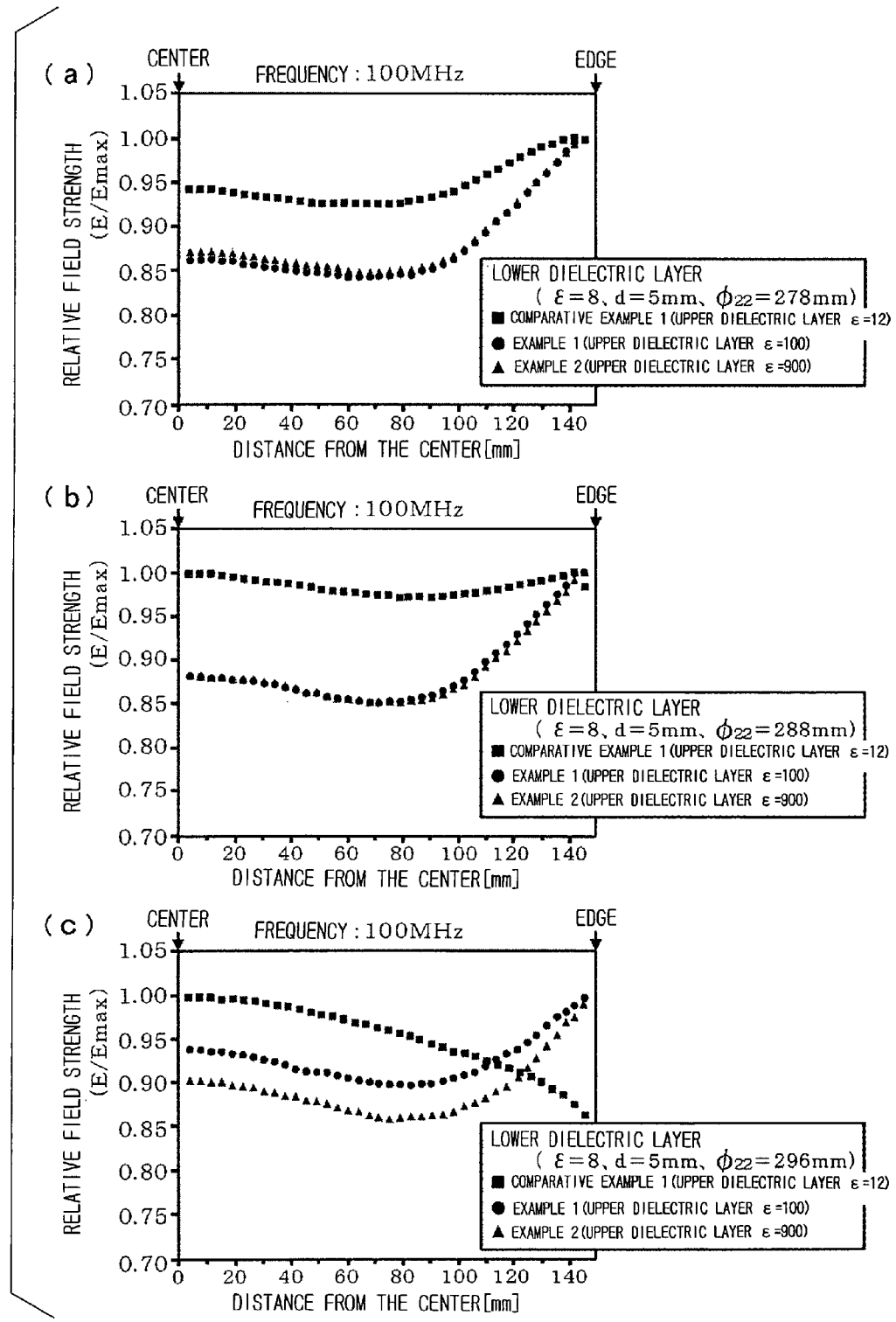
F I G. 7

TABLE FOR USE IN PLASMA PROCESSING SYSTEM AND PLASMA PROCESSING SYSTEM

CROSS REFERENCE TO PRIOR APPLICATIONS

This application claims priority from U.S. Provisional Application No. 60/844,368 filed on Sep. 14, 2006, and Japanese Patent Application No. 2006-217873 filed on Aug. 10, 2006. The entire contents of these applications are incorporated herein by reference.

BACKGROUND OF THE INVENTION

1. Field of the Invention

The present invention relates to a table on which a substrate to be subjected to plasma processing, such as a semiconductor wafer, is placed, and to a plasma processing system comprising the table.

2. Background Art

The process of semiconductor device production includes many processing steps in which a process gas is made into plasma and this plasma is used to process a substrate, such as dry etching and ashing. Of the plasma processing systems in which plasmas are used to process substrates, a processing system of the following type is often used: a pair of parallel plate electrodes are placed in a processing system with one of them positioned above the other; RF (radio frequency) power is applied to the space between the two electrodes to make a process gas fed to the system into plasma; and a substrate to be processed, such as a semiconductor wafer (hereinafter referred to as a wafer), placed on the lower electrode, is processed with the plasma.

In the plasma processing, processing that demands "low-energy, high-density plasmas", i.e., plasmas having low ion energy and high electron densities, has increased in recent years. There is therefore a case where the frequency of RF power to be used to produce plasmas is extremely high, e.g., 100 MHz, as compared with that of RF power conventionally used, e.g., over 10 MHz. However, when the frequency of the electric power to be applied is increased, the field strength tends to become higher in the center of the electrode surface, i.e., in the region corresponding to the center of a wafer, and to become lower in the region around it. When the field strength distribution becomes non-uniform in this way, the plasma produced also becomes non-uniform in electron density, so that the rate of processing, etc. vary depending on the position on a wafer surface. This has been a cause of the problem that a wafer processed with plasma, excellent in within-wafer uniformity, cannot be obtained.

In order to overcome such a problem, Japanese Laid-Open Patent Publication No. 2004-363552, paragraphs 84 and 85 on page 15, proposes a plasma processing system in which a dielectric having a relative dielectric constant of about 3.5 to 8.5, such as a ceramic material, is embedded in the center of one of the facing surfaces of two parallel plate electrodes in order to obtain a uniform field strength distribution, thereby obtaining a wafer processed with plasma, improved in within-wafer uniformity.

The embedment of such a dielectric in an electrode will now be described with reference to FIG. 3(b). A high-frequency current that has propagated along the face of an electrically conductive member 21, serving as a lower electrode, from below it and reached above the member 21 flows along the wafer W surface toward the center of the wafer W, but part of this current leaks to the electrostatic chuck 23 side, passes through a dielectric 24 constituting the electrostatic chuck 23, and flows along the interface between the dielectric 24 and the electrically conductive member 21 (the surface of the electrically conductive member 21) to the outside. In the part in which the dielectric 22 useful for making plasma uniform is embedded, the high-frequency current can flow deeper than in the other part and causes cavity cylindrical resonance of TM mode. Consequently, the electric field in the center, which will be applied to the plasma from the wafer W surface, can be decreased, and the electric field within the wafer W plane becomes uniform. This discussion is made on the premise that the specific resistance of an electrode film 25 for the electrostatic chuck is high.

However, the high-frequency current that has propagated along the face of the electrically conductive member 21 from below it and reached above the member 21, and the high-frequency current returned to the edge of the wafer W from below the dielectric 24 of the electrostatic chuck 23 and from below the dielectric 22 embedded in the electrically conductive member 21 in order to create plasma uniformly partly leak to the outside of the wafer W. For this reason, the electric potential of the plasma existing above the edge of the wafer W becomes low, and the rate of etching the wafer W thus becomes lower at the edge than in the center. Because of such non-uniformity in etching rate, the etched wafer W has been poor in within-wafer uniformity.

SUMMARY OF THE INVENTION

Under these circumstances, the present invention was accomplished. An object of the present invention is to provide a table for use in a plasma processing system, capable of increasing the rate of processing the edge of a substrate with plasma, thereby making it possible to obtain a substrate processed with plasma, improved in within-substrate uniformity, and a plasma processing system comprising such a table.

A table for use in a plasma processing system according to the present invention is a table for use in a plasma processing system, on which a substrate to be processed is placed, comprising an electrically conductive member connected to an RF (radio frequency) generator, functioning as an electrode for plasma formation or an electrode for attracting ions present in plasma; a first dielectric layer formed on the electrically conductive member so that it covers the center of the upper surface of the electrically conductive member, serving to make a high-frequency electric field to be applied to plasma via the substrate uniform; and a second dielectric layer having a relative dielectric constant of 100 or more, formed on the electrically conductive member so that it is in contact at least with the edge of the substrate, in order to prevent the high-frequency current that has propagated along the electrically conductive member face from leaking to the outside of the substrate and also to allow the high-frequency current to cause cavity cylindrical resonance of TM mode more efficiently.

In the above table, it is preferred that the second dielectric layer be formed so that it stretches from the position corresponding to the center of the substrate to the position corresponding to the edge of the substrate, and that an electrode film for an electrostatic chuck, fulfilling the following conditions, be embedded in the second dielectric layer:

$$\delta/t \geq 1{,}000$$

where $\delta = (2/\omega\mu\sigma)^{1/2}$, $\omega = 2\pi f$, and $\sigma = 1/\rho$, in which t is the thickness of the electrode film for an electrostatic chuck, $\delta$, the skin depth of the electrode film for an electrostatic chuck for the RF power supplied from the RF generator, f, the frequency of the RF power supplied from the RF generator, π, circular constant, μ, the magnetic permeability of the electrode for an electrostatic chuck, and ρ, the specific resistance of the electrode for an electrostatic chuck.

On the first dielectric layer, a dielectric layer for an electrostatic chuck may be formed, and the second dielectric layer may be formed so that it surrounds this dielectric layer for an electrostatic chuck.

In this case, it is preferred that the first dielectric layer be cylindrical in shape, where cavity cylindrical resonance of TM mode occurs in it, and also that its thickness be smaller at the edge than in the center. Further, it is favorable that the frequency of the RF power supplied from the RF generator be 13 MHz or more.

In the table for use in a plasma processing system according to the present invention, a first dielectric is embedded in the center of the table so that cavity cylindrical resonance of TM mode occurs in it, thereby decreasing the field strength in this region to flatten the high field strength part of the field strength distribution in a mountain-like shape. Further, a second dielectric layer having a high relative dielectric constant, serving as a conducting path for a high-frequency current, is provided at least in the position corresponding to the edge of a substrate so that the high-frequency current is prevented from leaking from the edge of the substrate to the outside. Cavity cylindrical resonance of TM mode thus occurs more efficiently. Consequently, the electric potential in the center of the electric field to be applied to plasma from the substrate surface can be lowered, and the electric field within the substrate plane becomes uniform. There can thus be obtained a substrate processed in plasma processing, e.g., plasma etching, improved in within-substrate uniformity.

BRIEF DESCRIPTION OF THE DRAWINGS

FIG. 5 is a longitudinal side view showing another modification of the table according to the embodiment of the invention.

FIG. 7 is diagrams showing the results of simulations done in order to confirm the effects of the present invention.

BEST MODE FOR CARRYING OUT THE INVENTION

Figure 1:
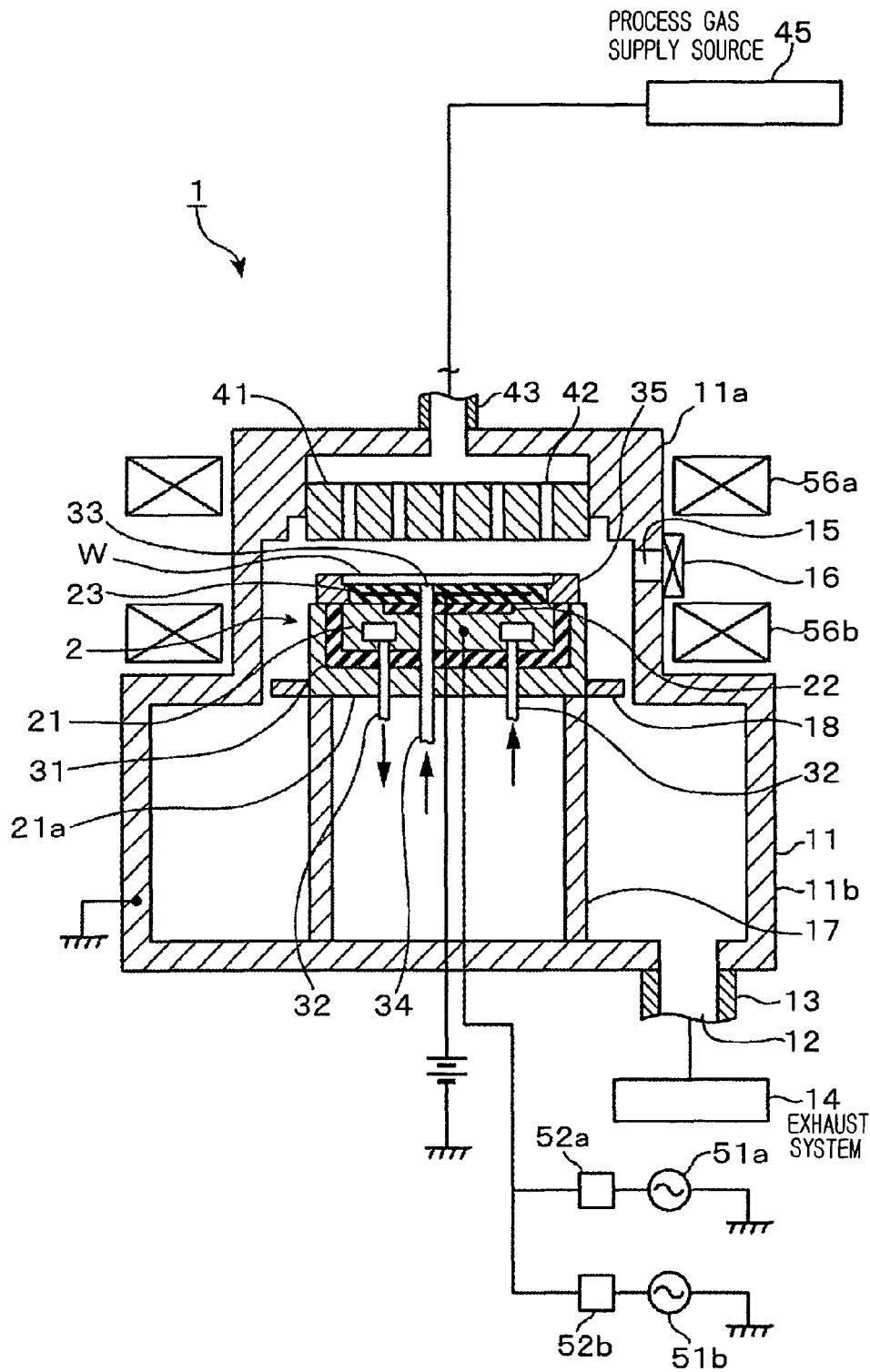
FIG. 1 is a longitudinal side view showing a plasma processing system having a table according to an embodiment of the present invention.

An embodiment that a table according to the present invention is used in a plasma processing system, an etching system, will be described with reference to FIG. 1. FIG. 1 shows a RIE (Reactive Ion Etching) plasma processing system 1. The plasma processing system 1 comprises a reaction vessel 11 composed of, for example, a vacuum chamber having an enclosed internal space, a table 2 placed on the base of the reaction vessel 11 in the center, and an upper electrode 41 provided above the table 2 and facing with the table 2.

The reaction vessel 11 is composed of an upper chamber 11a in the shape of a cylinder with a small diameter, and a lower chamber 11b in the shape of a cylinder with a great diameter. The upper chamber 11a and the lower chamber 11b are communicated with each other, and the whole reaction vessel 11 is airtight. The upper chamber 11a contains the table 2, the upper electrode 41, etc., and the lower chamber 11b contains a supporting plate 17 for supporting the table 2, in which pipes, etc. are laid. An exhaust port 12 in the base of the lower chamber 11b is connected to an exhaust system 14 by an exhaust pipe 13. To this exhaust system 14 is connected a pressure controller not shown in the figure, and this pressure controller serves to operate the exhaust system 14 according to the signal sent from a controller not shown in the figure so that the whole reaction vessel 11 is evacuated and is maintained at the desired degree of vacuum. On the other hand, an opening 15 through which a wafer W is carried in or out is made in the sidewall of the upper chamber 11a. This opening 15 can be opened or closed with a gate valve 16. The reaction vessel 11 is made of an electrically conductive material such as aluminum, and is grounded.

The table 2 is composed of a lower electrode 21 for plasma formation, which is an electrically conductive member made of such a material as aluminum, a dielectric 22 embedded, in order to make an electric field uniform, in the lower electrode 21 so that it covers the center of the upper surface of the lower electrode 21, and an electrostatic chuck 23 for holding a wafer W, provided on the lower electrode 21. The lower electrode 21 is fixed to a support 21a set on the supporting plate 17, with an insulating member 31 interposed between them, and is electrically floating in the reaction vessel 11.

A cooling medium passageway 32 through which a cooling medium flows is formed in the lower electrode 21, and the lower electrode 21 is cooled by the cooling medium flowing through this cooling medium passageway 32, whereby a wafer W placed on the upper surface (wafer-supporting surface) of the electrostatic chuck 23 is cooled to the desired temperature.

A through hole 33 through which a heat-conductive backside gas useful for increasing the efficiency of heat transfer between the upper surface of the electrostatic chuck 23 and the back surface of the wafer W is discharged is made in the electrostatic chuck 23. This through hole 33 is communicated with a gas flow line 34 made in the lower electrode 21, etc., and a backside gas, such as helium (He), supplied from a gas supply unit not shown in the figure flows through this gas flow line 34 and is discharged.

To the lower electrode 21, a first RF (radio frequency) generator 51a for supplying RF power having a frequency of 100 MHz, for example, and a second RF generator 51b for supplying RF power having a frequency of 3.2 MHz, for example, lower than that of the RF power supplied from the first RF generator, are connected via a matching unit 52a and a matching unit 52b, respectively. The RF power supplied from the first RF generator 51a serves to make a process gas, which will be described later, into plasma, and the RF power supplied from the second RF generator 51b serves to apply bias power to the wafer W, thereby attracting ions present in the plasma to the wafer W surface.

Around the periphery of the upper surface of the lower electrode 21, a focus ring 35 is placed so that it surrounds the electrostatic chuck 23. The focus ring 35 serves to control the state of the plasma present in the region outside the edge of the wafer W, e.g., it serves to make the plasma larger than the wafer W to make the etching rate more uniform within the wafer W plane.

A baffle 18 is externally provided at the lower part of the support 21a so that it surrounds the support 21a. The baffle 18 allows the process gas in the upper chamber 11a to flow in the lower chamber 11b via the gap between the baffle 18 and the wall of the upper chamber 11a. Thus, the baffle 18 serves as a regulator for regulating the flow of the process gas.

The upper electrode 41 is hollow, and its base has a large number of gas supply holes 42 through which a process gas is dispersively fed to the reaction vessel 11. Thus, the upper electrode 41 having in its base the gas supply holes 42 that are disposed uniformly, for example, serves as a gas shower head. A gas feed pipe 43 is provided in the center of the upper surface of the upper electrode 41. This gas feed pipe 43 penetrates the upper surface of the reaction vessel 11 and is connected to a process gas supply source 45 on the upstream side. Although not shown in the figure, the process gas supply source 45 has a mechanism for controlling the amount of a process gas to be supplied, and with this mechanism, the supply of a process gas to the plasma processing system 1 can be started or stopped and the amount of the process gas to be supplied can be increased or decreased. Further, since the upper electrode 41 is fixed to the wall of the upper chamber 11a, a conducting path is formed between the upper electrode 41 and the reaction vessel 11.

Two multi-pole ring magnets 56a, 56b are placed around the upper chamber 11a, above and below the opening 15. The multi-pole ring magnet 56a, 56b is that a plurality of anisotropic segment columnar magnets are attached to an annular magnetic casing, with each two neighboring anisotropic segment columnar magnets facing to directions opposite to each other. The magnetic line of force is therefore formed between each two neighboring anisotropic segment columnar magnets, and a magnetic field is formed around the process space between the upper electrode 41 and the lower electrode 21. The magnetic field can keep the plasma in the process space. The multi-pole ring magnets 56a, 56b are not essential in this embodiment.

Thus, a pair of parallel plate electrodes, the lower electrode 21 and the upper electrode 41, are provided in the reaction vessel 11 (the upper chamber 11a) in the plasma processing system 1. After reducing the pressure in the reaction vessel 11 to vacuum, a process gas is introduced into the reaction vessel 11 and RF power is supplied from the RF generators 51a, 51b. The process gas is thus made into plasma, and a high-frequency current flows via the route: the lower electrode 21→the plasma→the upper electrode 41→the wall of the reaction vessel 11→the ground. Due to such an action of the plasma processing system 1, the wafer W held on the table 2 is etched with the plasma.

The table 2 according to this embodiment will be described in detail with reference to FIG. 2. The cooling medium passageway 32, the through hole 33 through which a backside gas passes, etc. are omitted from FIG. 2, a longitudinal side view of the table 2.

Figure 2:
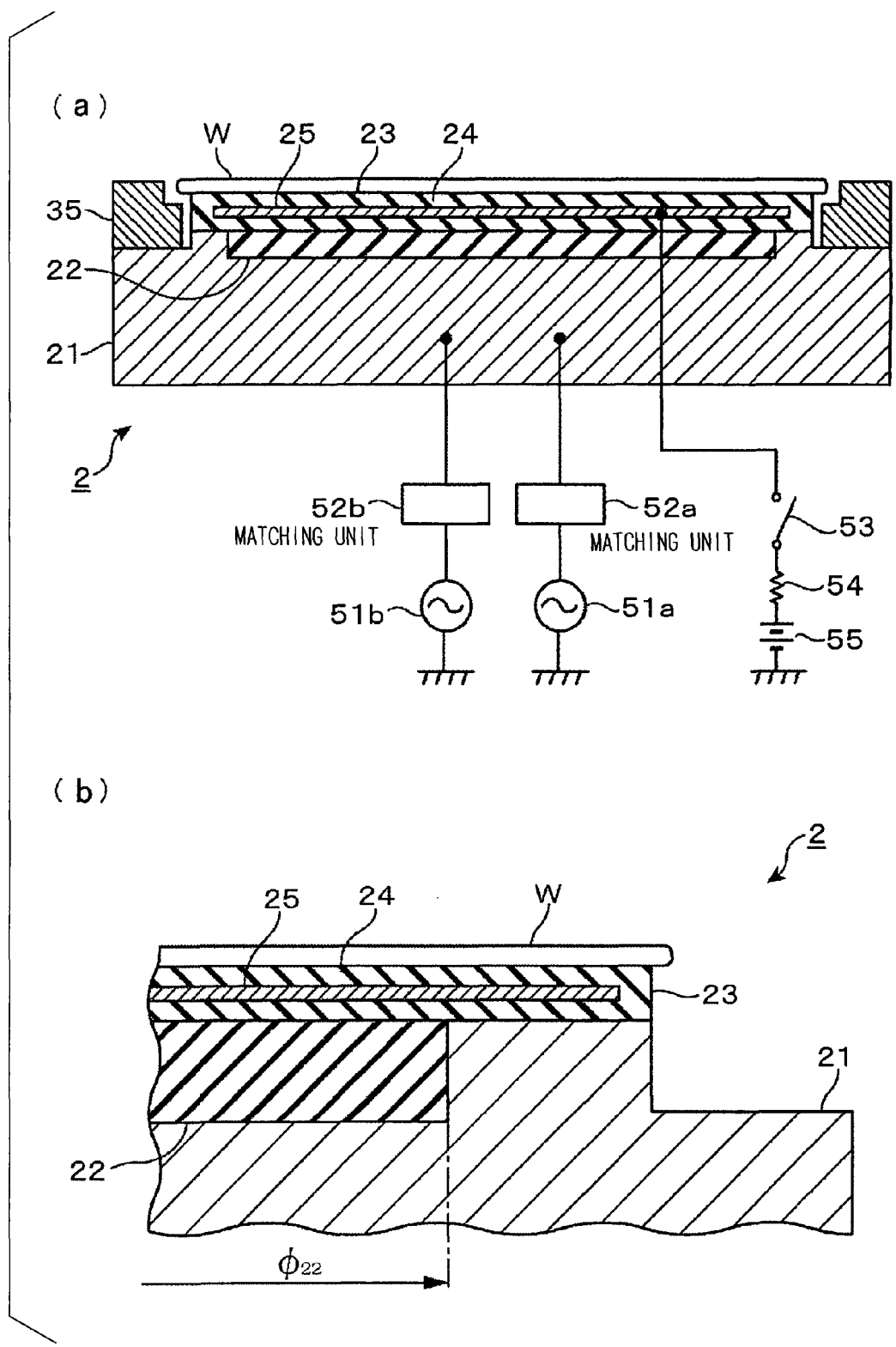
FIG. 2 is a longitudinal side view showing a table according to an embodiment of the present invention.

In the upper surface of the lower electrode 21, a lower dielectric layer 22, a first dielectric layer, is embedded in the center, as shown in FIG. 2. The lower dielectric layer 22 has the function of making the field strength in the dielectric-layer 22-embedded region lower. The lower dielectric layer 22 is made from a ceramic material having a relative dielectric constant ($\in_{22}$) of 10, containing as a main component alumina ($Al_2O_3$), for example. The lower dielectric layer 22 is in the shape of a cylinder with a thickness of 5 mm and a diameter $\phi_{22}$ of 288 mm, for example.

Next, the electrostatic chuck 23 will be described. The electrostatic chuck 23 is in the shape of a cylinder having a diameter almost the same as that of the upper surface of the lower electrode 21 and a thickness of 1 mm, and its structure is that an electrode film 25 with a thickness of about 0.3 mm, for example, is interposed between the upper and lower constituent layers of a second dielectric layer (hereinafter referred to as an upper dielectric layer 24). The upper dielectric layer 24 is made from a high dielectric material having a relative dielectric constant ($\in_{24}$) of 100 or more. The electrode film 25 is a 15-μm thick film having a specific resistance of 30 Ωcm, made from an electrode material consisting of alumina ($Al_2O_3$) and 35 wt. % of molybdenum carbide (MoC). The electrode film 25 has to fulfill the following conditions so that a high-frequency current can pass through it to ensure the effect of embedding the lower dielectric layer 22:

$$\delta/t \geq 1,000$$

where $\delta=(2/\omega\mu\sigma)^{1/2}$, $\omega=2\pi f$, and $\sigma=1/\rho$, in which t is the thickness [m] of the electrode film 25, δ, the skin depth [m] of the electrode film 25 for the RF power supplied from the RF generator 51a, f, the frequency of the RF power supplied from the RF generator 51a, π, circular constant, μ, the magnetic permeability [H/m] of the electrode film 25, and ρ, the specific resistance [Ωm] of the electrode film 25.

The electrode film 25 is connected to a high-voltage DC power supply 55 via a switch 53 and a resistor 54. When high-voltage DC power is applied to the electrode film 25 from the high-voltage DC power supply 55, a wafer W is electrostatically held on the upper surface of the electrostatic chuck 23 due to the Coulomb force occurring on the surface of the upper dielectric layer 24 of the electrostatic chuck 23.

The upper dielectric layer 24 has, as a constituent member of the electrostatic chuck 23, the function of holding a wafer W on its surface, as described above. Besides this function, it also has the function of making the transfer of RF power between the lower electrode 21 and the edge of a wafer W easier. Namely, as shown in FIG. 2(b), when a wafer W is placed on the electrostatic chuck 23, the upper dielectric layer 24 is sandwiched between the lower electrode 21 and the edge of the wafer W. Since the impedance of this part is determined by the capacitance of the upper dielectric layer 24, it is given by the equation $Z_{24}=j(-1/\omega C_{24})$, where $C_{24}$ is the capacitance of the upper dielectric layer 24 and ω is the circular frequency of the RF power. The capacitance of the upper dielectric layer 24 can be obtained from the equation $C_{24}=\in_0\in_{24}(S/d)$, where $\in_0$ is the dielectric constant of a vacuum, S is the area of the edge of the upper dielectric layer 24, and d is the thickness of the upper dielectric layer 24. Therefore, if a high dielectric material having a relative dielectric constant $\in_{24}$ of as high as 100 or more is used to form the upper dielectric layer 24, the impedance $Z_{24}$ of the part between the lower electrode 21 and the edge of the wafer W becomes smaller than that of the other region, so that it becomes easy for a high-frequency current to flow through this part. Consequently, the phenomenon that a high-frequency current leaks to the outside of the wafer W scarcely occurs, and the field strength in this part thus becomes higher as compared with the case where the upper dielectric layer 24 is not present.

Since the table 2 according to the embodiment has the above-described structure, a wafer W placed on the table 2 can be processed with plasma so that it has improved within-wafer uniformity. The possible reasons for this will be described below. The high-frequency current that has been supplied from the first RF generator 51a and propagated along the lower electrode 21 face partially flows to the upper electrode 21 surface from the wafer W surface via the upper dielectric layer 24 of the electrostatic chuck 23 and leaks. This current flows to the center of the wafer W while leaking. Since the lower dielectric layer 22 is embedded in the center of the lower electrode 21, the high-frequency current that propagates along the wafer W surface passes through the lower dielectric layer 22 and flows toward the outside along the interface between the lower dielectric layer 22 and the upper electrode 21. For the electrode film 25 of the electrostatic chuck 23, a material that has a high specific resistance and fulfills, for a high-frequency current, the conditions δ/t≥1,000 is used. Therefore, the high-frequency current that flows on the wafer W surface can pass through this electrode film 25. In other words, even if the electrode film 25 is present, the lower dielectric layer 22 can be seen from the plasma side, so that the plasma potential lowering action that occurs when the high-frequency current passes through the lower dielectric layer 22 is never impaired.

Figure 3:
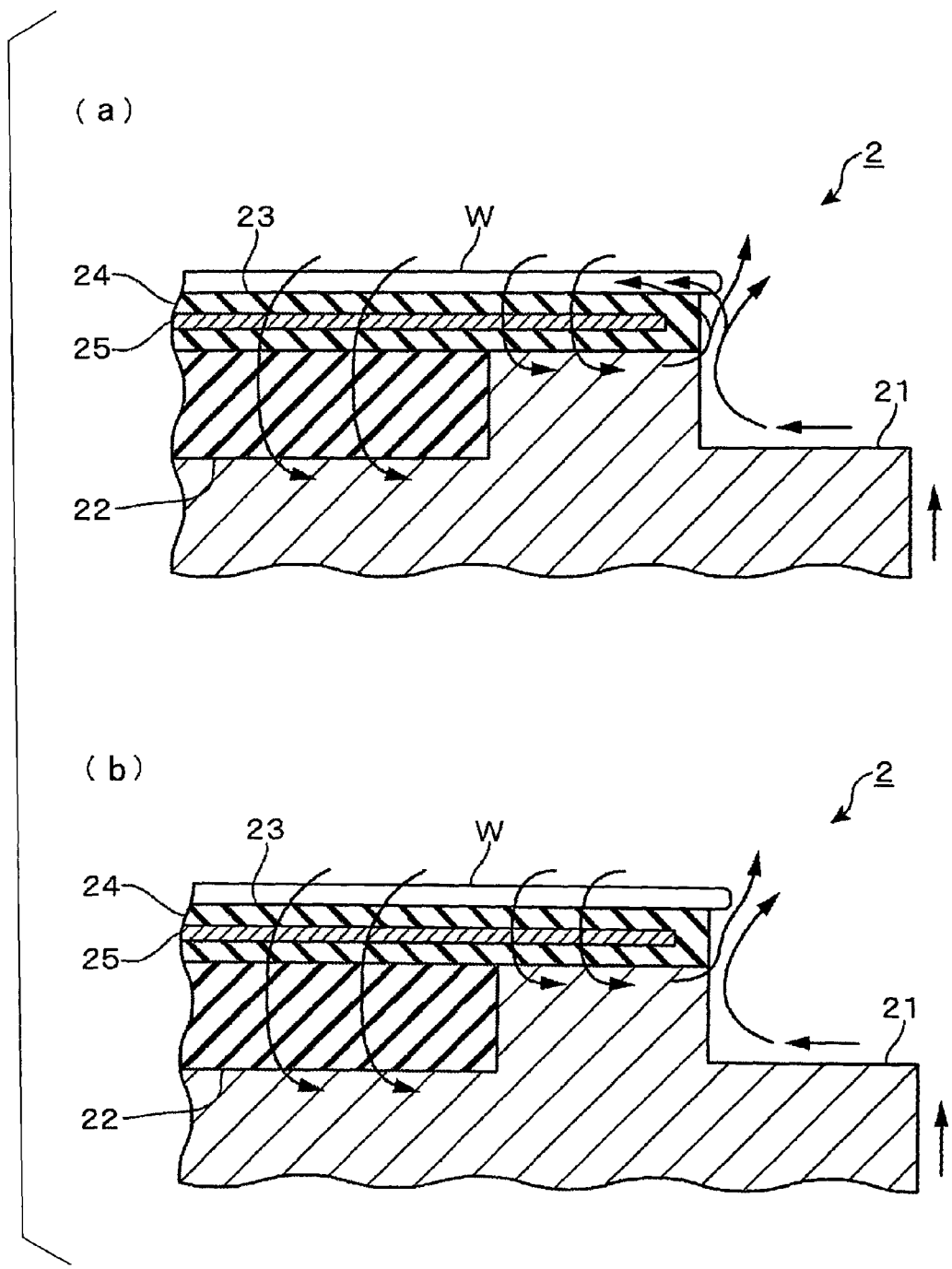
FIG. 3 is an explanatory view for explaining the action of the table.

In this embodiment, the upper dielectric layer 24 having a high dielectric constant, constituting the electrostatic chuck 23, is provided so that it stretches to the edge of the wafer W. Therefore, the lower electrode 21 and the edge of the wafer W are short-circuited by the upper dielectric layer 24 when viewed from the standpoint of the RF power. Thus, the high-frequency current that has propagated along the face of the lower electrode 21 from below it and reached above the lower electrode 21, and the high-frequency current returned to the edge of the wafer W from below the upper dielectric layer 24 and from below the lower dielectric layer 22 flow toward the center, so that the RF power to be supplied from the lower electrode 21 directly to the plasma without passing through the wafer W can be decreased. Consequently, the RF power is supplied to the plasma from above the edge of the wafer W. Due to this RF power and the lower dielectric layer 22, the plasma electron density becomes uniform within the wafer W plane. The wafer W can thus be more uniformly processed in plasma processing, e.g., plasma etching, to have improved within-wafer uniformity. On the contrary, when the upper dielectric layer 24 having a high relative dielectric constant is not present, a part of the high-frequency current leaks from the edge of the wafer W to the outside, as described in the description of the prior art with reference to FIG. 3(b), so that the density of the plasma in the region above the edge of the wafer W becomes low. In this case, therefore, the wafer W processed with plasma cannot have improved within-wafer uniformity.

The member having a high dielectric constant is highly dielectric. Therefore, even if lower high-voltage DC power is applied to the electrostatic chuck 23, the electrostatic chuck 23 can electrostatically hold the wafer W with the same level of force as in the prior art, which leads to improvement in energy efficiency.

Figure 4:
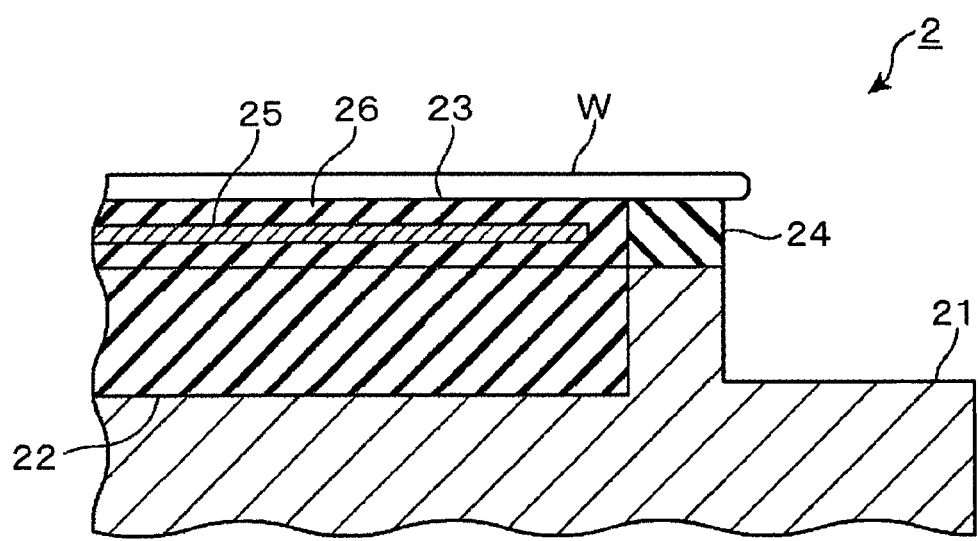
FIG. 4 is a longitudinal side view showing a modification of the table according to the embodiment of the invention.

The structure of the lower dielectric layer 22 and that of the upper dielectric layer 24 are not limited to the ones shown in the aforementioned embodiment. For example, as shown in FIG. 4, an annular upper dielectric layer 24 is provided so that it is in contact with the edge of a wafer W, and a high dielectric material is used only for making this upper dielectric layer 24. In this case, a dielectric 26 constituting the electrostatic chuck 23 may be made from a material whose dielectric constant is almost the same as that of the lower dielectric layer 22. Moreover, the lower dielectric layer 22 and the electrostatic chuck 23 may be made integrally. Further, the embodiment shown in FIG. 2 and the modified embodiment shown in FIG. 4 can be applied not only to tables provided with electrostatic chuck mechanisms, but also to tables of a type that a wafer is mechanically held with a mechanical chuck, for example.

The shape of the lower dielectric layer 22 is also not limited to a cylinder as described in the embodiment, and it may be a dome as shown in FIG. 5(a) or a corn as shown in FIG. 5(b), for example. By thus making the thickness of the lower dielectric layer 22 smaller at the edge than in the center, the field strength becomes lower in the center than at the edge, and the field strength distribution becomes flatter.

Since the linear expansion coefficients of ceramic materials that are used for the dielectric layers are usually in the range of $2\times10^{-6}/°$ C. to $11\times10^{-6}/°$ C., it is preferable to use a material having a linear expansion coefficient in the vicinity of this range to make the electrically conductive member, the electrode.

EXAMPLES

Simulations

A parallel plate plasma processing system as shown in FIG. 1 was modeled and was used to simulate the field strength distribution on a wafer W.

A. Simulation Conditions

Specific resistance of electrode film 25: 0.20 Ωm
Specific resistance of wafer W: 0.05 Ωm
Specific resistance of plasma: 1.5 Ωm
Relative dielectric constant $\in_{22}$ of lower dielectric layer 22: 8
Relative dielectric constant $\in_{24}$ of upper dielectric layer 24: varied depending on the conditions set in Examples and Comparative Example
Electric power applied: 2 kW (frequency 40 MHz, 100 MHz)

In the simulations, the thickness of the upper dielectric layer 24 (electrostatic chuck 23) was set to 1 mm, that of the electrode film 25, to 0.3 mm, and that of the lower dielectric layer 22, to 5 mm. Further, the simulations were done for the cases where the diameter of the lower dielectric layer 22 is 278 mm, 288 mm, and 296 mm.

Under the above-described conditions, the field strength distributions, in the direction of radius, on wafers W placed on the tables 2 according to the following Examples and Comparative Example were simulated.

Example 1

The relative dielectric constant $\in_{24}$ of the upper dielectric layer 24 was set to 100.

Example 2

The relative dielectric constant $\in_{24}$ of the upper dielectric layer 24 was set to 900.

Comparative Example 1

The relative dielectric constant $\in_{24}$ of the upper dielectric layer 24 was set to 12.

B. Results of Simulations

Figure 6:
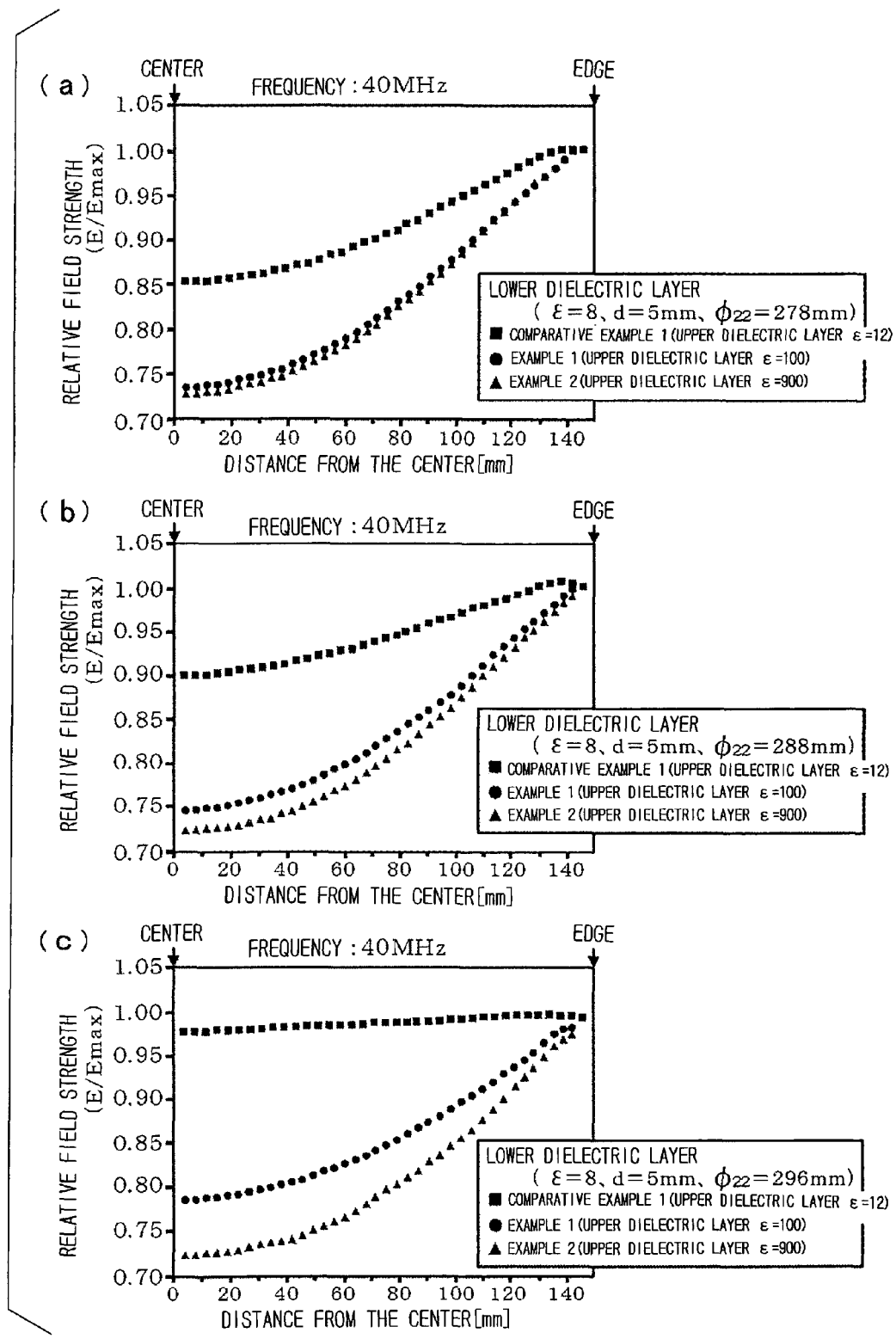
FIG. 6 is diagrams showing the results of simulations done in order to confirm the effects of the present invention.

The field strength distributions obtained from the simulations done in Examples and Comparative Example are shown in FIGS. 6 and 7. FIGS. 6(a), 6(b) and 6(c) show the results of the simulations in which the diameter of the lower dielectric layer 22 was set to 278 mm, 288 mm, and 296 mm, respectively. Each graph plots distance [mm], in the direction of radius, from the center [0] of a wafer W as the abscissa and relative field strength (=field strength E at a certain point obtained from the simulation/maximum field strength Emax obtained from the simulation) as the ordinate. In FIGS. 6 and 7, circles (●) show the results of the simulation done in Example 1, triangles (▲), the results of the simulation done in Example 2, and squares (■), the results of the simulation done in Comparative Example 1.

The results of the simulations show the following: when the relative dielectric constant $\in_{24}$ of the upper dielectric layer 24 is as high as 100 or 900, the field strength at the edge of the wafer W can be made high independently of the diameter of the lower dielectric layer 22 (● and ▲ in FIGS. 6(a) to 6(c)). On the other hand, when the upper dielectric layer 24 has a relative dielectric constant $\in_{24}$ of 12, the field strength at the edge of the wafer W can be made high (■ in FIGS. 6(a) and 6(b)) or scarcely made high (■ in FIG. 6(c)) depending on the diameter of the lower dielectric layer 22. Even if the field strength can be made high, the increase in field strength is smaller than that when a high dielectric material is used.

The same simulations as those described above were done, provided that the frequency of the RF power applied was changed from 40 MHz to 100 MHz, and the results of these simulations are shown in FIG. 7. FIGS. 7(a), 7(b) and 7(c) show the results of the simulations in which the diameter of the lower dielectric layer 22 was set to 278 mm, 288 mm, and 296 mm, respectively. In FIG. 7, the results of the simulations done in Examples and Comparative Example are plotted using the same symbols as in FIG. 6.

The results of the simulations show the following: when the relative dielectric constant $\in_{24}$ of the upper dielectric layer 24 is as high as 100 or 900, the field strength at the edge of the wafer W can be made high independently of the diameter of the lower dielectric layer 22 (● and ▲ in FIGS. 7(a) to 7(c)). On the other hand, when the relative dielectric constant $\in_{24}$ of the upper dielectric layer 24 is 12, the field strength at the edge of the wafer W cannot be made high when the diameter of the lower dielectric layer 22 is 288 mm or 296 mm (■ in FIGS. 7(b) and 7(c)). In particular, when the diameter of the upper dielectric layer 24 is 296 mm, the field strength at the edge of the wafer W is lower than that in the other region contrary to the purpose (■ in FIG. 7(c)). Even if the field strength can be made high, the increase in field strength is smaller than that when a high dielectric material is used (■ in FIG. 7(a)). The field strength at the edge of a wafer W can thus be made high when the upper dielectric layer having a high relative dielectric constant $\in_{24}$ is used, and this is not limited to the case where RF power having the frequency used in the simulations is applied. Even when RF power having a frequency of 13 MHz or 27 MHz is applied, the same effects can be obtained.

The invention claimed is:

1. A table for use in a plasma processing system, on which a substrate to be processed is placed, comprising:
   an electrically conductive member connectible to an RF generator to function as a first electrode for plasma formation or a first electrode for attracting ions present in plasma,
   a first dielectric layer having a first relative dielectric constant, formed on the electrically conductive member so that it covers the center of the upper surface of the electrically conductive member to make a high-frequency electric field to be applied to plasma via the substrate uniform, and
   an electrostatic chuck covering the first dielectric layer and the electrically conductive member for electrostatically holding the substrate to be processed wherein the electrostatic chuck includes
      a second dielectric layer having a second relative dielectric constant that is more than 100, formed on the electrically conductive member so that it is in contact at least with the edge of the substrate to prevent high-frequency current that has propagated along the electrically conductive member face from leaking to outside of the substrate, and
      a second electrode, connectible to a DC power supply, embedded in the second dielectric layer, and
   wherein the first dielectric layer is separated from the second dielectric layer,
   wherein the first relative dielectric constant is lower than the second relative dielectric constant,
   wherein the diameter of the second dielectric layer is greater than the diameter of the first dielectric layer,
   wherein the second dielectric layer is formed so that it stretches from the position corresponding to the center of the substrate to the position corresponding to the edge of the substrate, and
   wherein the second electrode fulfills the following condition:

$$\delta/t \geq 1{,}000$$

where $\delta=(2/\omega\mu\sigma)^{1/2}$, $\omega=2\pi f$, and $\sigma=1/\rho$,
in which t is the thickness of the second electrode, δ, the skin depth of the second electrode for RF power supplied from the RF generator, f, the frequency of RF power supplied from the RF generator, π, circular constant, μ, the magnetic permeability of the second electrode, and ρ, the specific resistance of the second electrode.

2. The table for use in a plasma processing system according to claim 1, wherein on the first dielectric layer, a dielectric layer for the electrostatic chuck is formed, and the second dielectric layer is formed so that it surrounds the dielectric layer for the electrostatic chuck.

3. The table for use in a plasma processing system according to claim 1, wherein the first dielectric layer is cylindrical in shape.

4. The table for use in a plasma processing system according to claim 1, wherein the thickness of the first dielectric layer is smaller at the edge than in the center.

5. The table for use in a plasma processing system according to claim 1, wherein the frequency of the RF power supplied from the RF generator is 13 MHz or more.

6. A plasma processing system comprising:
   a reaction vessel in which a substrate to be processed is processed with plasma,
   a process gas feed part for feeding a process gas to the reaction vessel,
   a table for a plasma processing system on which a substrate to be processed is placed, provided in the reaction vessel,
   an upper electrode provided above the table and facing with the table, and
   a part for evacuating the reaction vessel, characterized in that the table comprises:
   an electrically conductive member connected to an RF generator, functioning as an electrode for plasma formation or an electrode for attracting ions present in plasma,
   a first dielectric layer having a first relative dielectric constant, formed on the electrically conductive member so that it covers the center of the upper surface of the electrically conductive member to make a high-frequency electric field to be applied to plasma via the substrate uniform, and
   an electrostatic chuck covering the first dielectric layer and the electrically conductive member for electrostatically holding the substrate to be processed, wherein the electrostatic chuck includes
      a second dielectric layer having a second relative dielectric constant that is more than 100, formed on the electrically conductive member so that it is in contact at least with the edge of the substrate to prevent high-frequency current that has propagated along the electrically conductive member face from leaking to outside of the substrate, and an electrode, connectible to a DC power supply, embedded in the second dielectric layer, and wherein the first dielectric layer is separated from the second dielectric layer, wherein the first relative dielectric constant is lower than the second relative dielectric constant, wherein the diameter of the second dielectric layer is greater than the diameter of the first dielectric layer, wherein the second dielectric layer is formed so that it stretches from the position corresponding to the center of the substrate to the position corresponding to the edge of the substrate, and wherein the electrode connectible to the DC power supply fulfills the following conditions:

$$\delta/t \geq 1{,}000$$

where $\delta = (2/\omega\mu\sigma)^{1/2}$, $\omega = 2\pi f$, and $\sigma = 1/\rho$, in which t is the thickness of the connectible electrode, $\delta$, the skin depth of the connectible electrode for RF power supplied from the RF generator, f, the frequency of RF power supplied from the RF generator, $\pi$, circular constant, $\mu$, the magnetic permeability of the connectible electrode, and $\rho$, the specific resistance of the connectible electrode.

7. A table for use in a plasma processing system, on which a substrate to be processed is placed, comprising:

an electrically conductive member connectible to an RF generator to function as a first electrode for plasma formation or an electrode for attracting ions present in plasma, a first dielectric layer having a first relative dielectric constant, formed on the electrically conductive member so that it covers the center of the upper surface of the electrically conductive member to make uniform a high-frequency electric field to be applied to plasma via the substrate, and an electrostatic chuck covering the first dielectric layer and the electrically conductive member for electrostatically holding the substrate to be processed, wherein the electrostatic chuck includes a second dielectric layer having a second relative dielectric constant that is more than 100, and a second electrode, connectible to a DC power supply, embedded in the second dielectric layer, and wherein the second relative dielectric constant is greater than the first relative dielectric constant, and the second dielectric layer is in contact at least with the edge of the substrate to prevent high-frequency current propagating along the electrically conductive member face from leaking outside of the substrate.

8. The table for use in a plasma processing system according to claim 7, wherein the second dielectric layer is formed so that it stretches from the position corresponding to the center of the substrate to the position corresponding to the edge of the substrate, and the second electrode fulfills the following conditions:

$$\delta/t \geq 1{,}000$$

where $\delta = (2/\omega\mu\sigma)^{1/2}$, $\omega = 2\pi f$, and $\sigma = 1/\rho$, in which t is the thickness of the second electrode, $\delta$, the skin depth of the second electrode for RF power supplied from the RF generator, f, the frequency of RF power supplied from the RF generator, $\pi$, circular constant, $\mu$, the magnetic permeability of the second electrode, and $\rho$, the specific resistance of the second electrode.

9. The table for use in a plasma processing system according to claim 7, wherein the second dielectric layer is formed so that it surrounds the second electrode.

10. The table for use in a plasma processing system according to claim 7, wherein the first dielectric layer is cylindrical in shape.

11. The table for use in a plasma processing system according to claim 7, wherein the thickness of the first dielectric layer is smaller at the edge than in the center.

12. A plasma processing system comprising:

a reaction vessel in which a substrate to be processed is processed with plasma, a process gas feed part for feeding a process gas to the reaction vessel, a table for a plasma processing system on which a substrate to be processed is placed, provided in the reaction vessel, a means for generating plasma in the reaction vessel, a D-C power supply, an upper electrode provided above the table and facing the table, and a means of evacuating the reaction vessel, characterized in that the table comprises:

an electrically conductive member functioning as a first electrode for plasma formation or an electrode for attracting ions present in plasma, a first dielectric layer having a first relative dielectric constant, formed on the electrically conductive member so that it covers the center of the upper surface of the electrically conductive member to make uniform a high-frequency electric field to be applied to plasma via the substrate, an electrostatic chuck covering the first dielectric layer and the electrically conductive member for electrostatically holding the substrate to be processed, wherein the electrostatic chuck includes a second dielectric layer having a second relative dielectric constant that is more than 100, and an electrode connected to the DC power supply and embedded in the second dielectric layer, wherein the second relative dielectric constant is greater than the first relative dielectric constant, and the second dielectric layer is in contact at least with the edge of the substrate to prevent high-frequency current propagating along the electrically conductive member face from leaking outside of the substrate.

13. The plasma processing system according to claim 12 further comprising a first RF generator and a second RF generator, wherein the first electrode is connected to the first RF generator that supplies a first high-voltage power to the first electrode in a first frequency, and the first electrode is connected the a second RF generator that supplies a second high-voltage power to the first electrode in a second frequency, and wherein the second frequency is lower than the first frequency.

* * * * *